(12) United States Patent
Kingsley et al.

(10) Patent No.: US 6,479,979 B1
(45) Date of Patent: Nov. 12, 2002

(54) OPTO-ELECTRIC DEVICE FOR MEASURING THE ROOT-MEAN-SQUARE VALUE OF AN ALTERNATING CURRENT VOLTAGE

(75) Inventors: Stuart A. Kingsley, Bexley; Sriram S. Sriram, Powell, both of OH (US); Meindert Kleefstra, Salmon Creek, WA (US)

(73) Assignee: Srico, Inc., Columbus, OH (US)

( * ) Notice: Subject to any disclaimer, the term of this patent is extended or adjusted under 35 U.S.C. 154(b) by 21 days.

(21) Appl. No.: 09/610,544

(22) Filed: Jul. 4, 2000

Related U.S. Application Data
(60) Provisional application No. 60/143,118, filed on Jul. 9, 1999.

(51) Int. Cl.[7] ............................................. G01R 31/00
(52) U.S. Cl. ...................................................... 324/96
(58) Field of Search ........................ 324/96, 752, 750, 324/751, 765, 244.1; 385/8; 356/364, 345; 250/310, 311

(56) References Cited

U.S. PATENT DOCUMENTS

| | | |
|---|---|---|
| 3,993,947 A | 11/1976 | Maltby et al. |
| 4,061,891 A | 12/1977 | Pommer |
| 4,200,933 A | 4/1980 | Nickel et al. |
| 4,364,027 A | 12/1982 | Murooka |
| 4,414,638 A | 11/1983 | Talambiras |
| 4,552,457 A | 11/1985 | Giallorenzi et al. |
| 4,616,329 A | 10/1986 | Abrams et al. |
| 4,758,060 A | 7/1988 | Jaeger et al. |
| 4,772,083 A | 9/1988 | Ahmed |
| 4,797,607 A | 1/1989 | Dupraz |
| 4,799,008 A | 1/1989 | Kannari |
| 4,859,936 A | 8/1989 | Eccleston |
| 4,899,042 A | 2/1990 | Falk et al. |
| 4,904,931 A * | 2/1990 | Miller .......................... 324/96 |
| 4,931,976 A | 6/1990 | Olivenbaum et al. |
| 5,003,624 A | 3/1991 | Terbrack et al. |

(List continued on next page.)

OTHER PUBLICATIONS

Paulter, N. G. *An electro–optic based RMS voltage measurement technique* Rev. Sci. Instrum. vol. 66, No. 6(Jun., 1995), pp. 3683–3690.

Wooten, E. L. et al. *A Review of Lithium Niobate Modulators for Fiber–Optic Communication Systems* IEEE Journal of Selected Topics in Quantum Electronics vol. 6, No. 1 (Jan./Feb., 2000), pp. 69–82.

*Primary Examiner*—Vinh P. Nguyen
(74) *Attorney, Agent, or Firm*—Philip J. Pollick

(57) ABSTRACT

An opto-electric device for measuring the root mean square value of an alternating current voltage comprises: a) an electric field-to-light-to-voltage converter having 1) a light source; 2) an electro-optic material: (a) receiving light from the light source; (b) modulating said light; and (c) providing a modulated light output; 3) an electric field applied to the electro-optic crystal to modulate the light from the light source to produce the modulated light output; b) an optical receiver for receiving and converting the modulated output light from the electro-optic material to a first voltage that is proportional to a square of the electric field applied to the electro-optic material; c) an averager circuit receiving the first voltage and providing a second voltage that is proportional to the average of said square of said electric field over a period of time; and d) an inverse ratiometric circuit receiving the second voltage from the averager circuit and returning a third voltage that is an inverse voltage of the second voltage to the electric field-to-light-to-voltage converter to produce an output voltage that is the root mean square voltage of the applied electric field. The device uses a Mach__Zehnder interferometer operating a a square law device and features a housing for maintaining the interferometer at constant temperature using a temperature control unit. A nulling circuit is provided to maintain the interferometer at it null operating point as are calibration circuits to correct for voltage amplitude and frequency changes.

9 Claims, 9 Drawing Sheets

U.S. PATENT DOCUMENTS

| | | |
|---|---|---|
| 5,006,790 A | 4/1991 | Beverly, II et al. |
| 5,012,181 A | 4/1991 | Eccleston |
| 5,014,229 A | 5/1991 | Mofachem |
| 5,028,886 A | 7/1991 | Seibel et al. |
| 5,046,848 A | 9/1991 | Udd |
| 5,123,023 A | 6/1992 | Santarelli et al. |
| 5,175,492 A | 12/1992 | Wong et al. |
| 5,230,028 A | 7/1993 | Lin et al. |
| 5,253,309 A * | 10/1993 | Nazarathy et al. ............. 385/8 |
| 5,267,336 A | 11/1993 | Sriram et al. |
| 5,287,366 A | 2/1994 | Epworth et al. |
| 5,317,443 A | 5/1994 | Nishimoto |
| 5,321,503 A | 6/1994 | Bramson |
| 5,321,543 A | 6/1994 | Huber |
| 5,327,279 A | 7/1994 | Farina et al. |
| 5,440,113 A | 8/1995 | Morin et al. |
| 5,440,229 A | 8/1995 | Schieman |
| 5,453,608 A | 9/1995 | Conder et al. |
| 5,477,323 A | 12/1995 | Andrews et al. |
| 5,488,503 A | 1/1996 | Schaffner et al. |
| 5,586,040 A | 12/1996 | Baumgart et al. |
| 5,642,195 A | 6/1997 | Drachev et al. |
| 5,687,018 A | 11/1997 | Funaki |
| 5,734,596 A | 3/1998 | Medelius et al. |
| 5,808,473 A * | 9/1998 | Shinagawa et al. ......... 324/753 |
| 5,909,297 A | 6/1999 | Ishikawa et al. |
| 5,933,013 A | 8/1999 | Kimura |
| 5,963,034 A | 10/1999 | Mahapatra et al. |

* cited by examiner

OPTO-ELECTRIC DEVICE FOR MEASURING THE ROOT-MEAN-SQUARE VALUE OF AN ALTERNATING CURRENT VOLTAGE

CROSS REFERENCE TO RELATED APPLICATION

This application claims the benefit of U.S. Provisional Application 60/143,118 filed on Jul. 9, 1999 all of which is incorporated by reference as if completely written herein.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of contract No. N00024-97-C-4208 awarded by the Navel Sea Systems Command of the United States Department of the Navy.

BACKGROUND OF THE INVENTION

1. Field of the Invention

This invention relates, in general, to an apparatus for measuring voltage and more particularly to apparatus for measuring the true root-mean-square (rms) voltage of an applied voltage signal.

2. Background of the Invention

True rms voltage electronic measurement devices are known and widely used. These devices electronically convert the AC voltage to a direct current (DC) output by squaring the voltage, averaging and then obtaining a square root. Integrated circuits (ICs) such as the AD536 from Analog Devices, Norwood, Mass. have less than 1% error at frequencies up to about 140 kHz with a 7 V rms input and 6 kHz at a 10 mV rms input. A wide-bandwidth multiplier (squarer) such as the AD834 allows input bandwidth from 5 Hz to over 20 MHz and a peak input of 10 V. The dynamic range of such devices is limited because the squarer must deal with a signal that varies enormously in amplitude. For example, an input signal of 1 mV to 100 mV results in a 1 mV to 10,000 mV (10V) at the output of the squarer. Because of this effect, such devices are typically limited to a 10:1 dynamic range. To overcome this difficulty, the average of the output of the circuit is used to divide the input of the circuit. As such, the signals vary linearly rather than as the square of the input voltage. Although this increases the dynamic range of the circuit, it comes at the expense of less bandwidth.

For the most accurate true rms voltage measurement, thermal voltage converter devices are used. These devices measure the rms value of the voltage by applying the unknown voltage to a heating element and then measuring the temperature change produced in the heating element. By comparing the heating value of an unknown ac signal to the heating value of a known calibrated dc reference, the value of the dc reference will equal the rms value of the unknown signal. Instruments such as the Fluke 540, WaveTek/Datron 4920M, and other thermal voltage converters provide excellent performance at frequencies up to 1 MHz where the error is less than 0.1%, i.e., 100 ppm. Above 1 MHz, the error is about 1% while at 20 MHz the error increases to about 2%. Although the accuracy of the thermal voltage converter is superior to integrated circuit (IC)-based devices, the instruments are very fragile, have a limited dynamic range (typically of the order of 10 db), and are easily damaged by small overloads. Morever, the heating process is relatively slow and making a series of measurements at just one frequency is very time consuming.

In an effort to overcome some of the prior art limitations, Paulter (N.G. Paulter, "An electro-optic-based RMS voltage measurement technique," *Rev. Sci. Instrum.*, Vol. 66 No. 6, June 1995, pp. 3683–3690) has developed an electro-optic device. The Paulter approach is based on an electro-optic cell that requires bulk optic components such as a large crystal, light beam splitters, lenses, and polarizers which introduce their own set of problems including alignment and stabilization considerations. Such bulk components and supporting setup are neither light weight nor portable. Further, since the device operates as a square law device, the range of voltage that can be handled is severely limited.

In order to overcome these and other problems of the prior art instruments, it is an object of the present invention to provide a true root-mean square ac measuring device that utilizes an integrated electro-optical device.

It is another object of the present invention to provide a true root-mean square ac measuring device that has a high measurement bandwidth.

It is another object of the present invention to provide a true root-mean square ac measuring device that has a high damage overload threshold.

It is another object of the present invention to provide a true root-mean square ac measuring device that is compact in size.

It is another object of the present invention to provide a true root-mean square ac measuring device that has high sensitivity.

It is another object of the present invention to provide a true root-mean square ac measuring device that has high measurement reliability.

It is another object of the present invention to provide a true root-mean square ac measuring device that is optically isolated from its input source.

Yet another object of the present invention is to provide a true root-mean square ac measuring device that provides temperature stability to an electro-optical component.

It is another object of the present invention to provide a true root-mean square ac measuring device that provides null correction to an electro-optical component.

It is another object of the present invention to provide a true root-mean square ac measuring device that provides an ac reference voltage to an electro-optical component.

It is another object of the present invention to provide a true root-mean square ac measuring device that provides frequency correction for the output voltage.

It is another object of the present invention to provide a true root-mean square ac measuring device that provides amplitude correction for the output voltage.

Yet another object of the present invention is to provide a true root-mean square ac measuring device that is free of electromagnetic interference.

It is another object of the present invention to provide a rapid method of taking true room-mean square ac measurements, especially at high frequencies.

SUMMARY OF THE INVENTION

An opto-electric device for measuring the root mean square value of an alternating current voltage comprises: a) an electric field-to-light-to-voltage converter having 1) a light source; 2) an electro-optic material: (a) receiving light from the light source; (b) modulating said light; and (c) providing a modulated light output; 3) an electric field applied to the electro-optic crystal to modulate the light from the light source to produce the modulated light output; b) an optical receiver for receiving and converting the modulated output light from the electro-optic material to a first voltage that is proportional to a square of the electric field applied to the electro-optic material; c) an averager circuit receiving the first voltage and providing a second voltage that is proportional to the average of said square of said electric field over a period of time; and d) an inverse ratiometric circuit receiving the second voltage from the averager circuit and returning a third voltage that is an inverse voltage of the second voltage to the electric field-to-light-to-voltage converter to produce an output voltage that is the root mean square voltage of the applied electric field. The device uses a Mach_Zehnder interferometer operating a a square law device and features a housing for maintaining the interferometer at constant temperature using a temperature control unit. A nulling circuit is provided to maintain the interferometer at it null operating point as are calibration circuits to correct for voltage amplitude and frequency changes.

The foregoing and other objects, features and advantages of the invention will become apparent from the following disclosure in which one or more preferred embodiments of the invention are described in detail and illustrated in the accompanying drawings. It is contemplated that variations in procedures, structural features and arrangement of parts may appear to a person skilled in the art without departing from the scope of or sacrificing any of the advantages of the invention.

Figure 1:
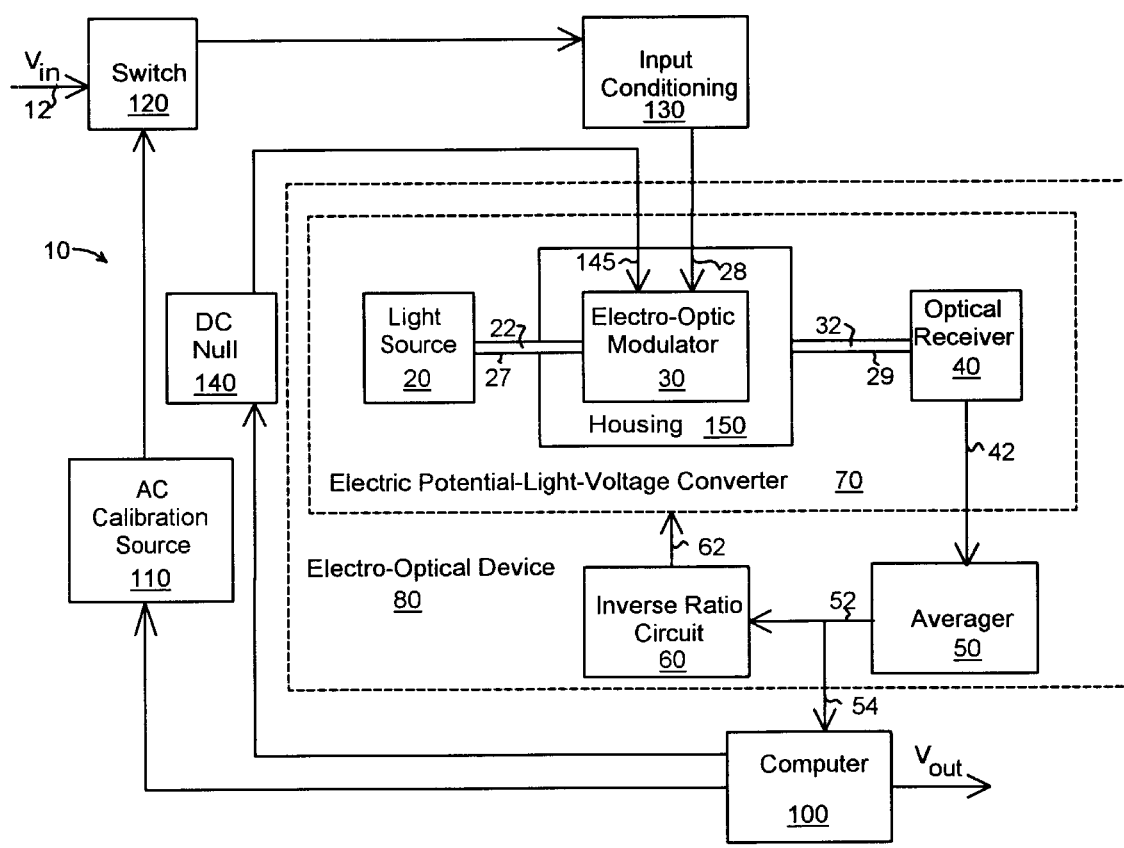
FIG. 1 is a schematic block diagram of the present invention illustrating the electro-optical device including the electro-optical squarer for modulating light by means of an electric field and converting the modulated light to a voltage that is averaged and inverted to provide a root-mean-square voltage of the input voltage. A DC null and AC calibration circuit along with input voltage switching and conditioning under the control of a computer are shown.

In describing the preferred embodiment of the invention which is illustrated in the drawings, specific terminology is resorted to for the sake of clarity. However, it is not intended that the invention be limited to the specific terms so selected and it is to be understood that each specific term includes all technical equivalents that operate in a similar manner to accomplish a similar purpose.

Although a preferred embodiment of the invention has been herein described, it is understood that various changes and modifications in the illustrated and described structure can be affected without departure from the basic principles that underlie the invention. Changes and modifications of this type are therefore deemed to be circumscribed by the spirit and scope of the invention, except as the same may be necessarily modified by the appended claims or reasonable equivalents thereof.

DETAILED DESCRIPTION OF THE INVENTION AND BEST MODE FOR CARRYING OUT THE PREFERRED EMBODIMENT

With reference to the drawings and initially FIG. 1, a measurement device 10 for measuring the true root-meansquare value of an alternating current comprises an electric field-light-voltage converter 70 with a light source 20, electro-optical device 30 for receiving and modulating light 22 from the light source 20 as a square law device under the influence of an electric field produced by an input voltage from line 28. The modulated light 32 is received by an optical receiver 40 to produce a first voltage that is proportional to the square of the input voltage in line 28. The first voltage passes to an averager 50 by means of connection 42 where averager 50 provides a second voltage that is proportional to the average of the square of the electric field over a period of time. The voltage output in line 52 is then feed to an inverse ratio circuit 60 that returns an inverse voltage of the voltage in line 52 to the electric potential-light-voltage converter 70 by means of line 62. By feeding back the inverse voltage to converter 70, an output voltage is produced in line 54 that is the root mean square voltage of the applied electric field produced by the input voltage in line 28. Typically the output voltage in line 54 is used in conjunction with a high-precision digital dc voltmeter for display of the true rms voltage.

Figure 3:
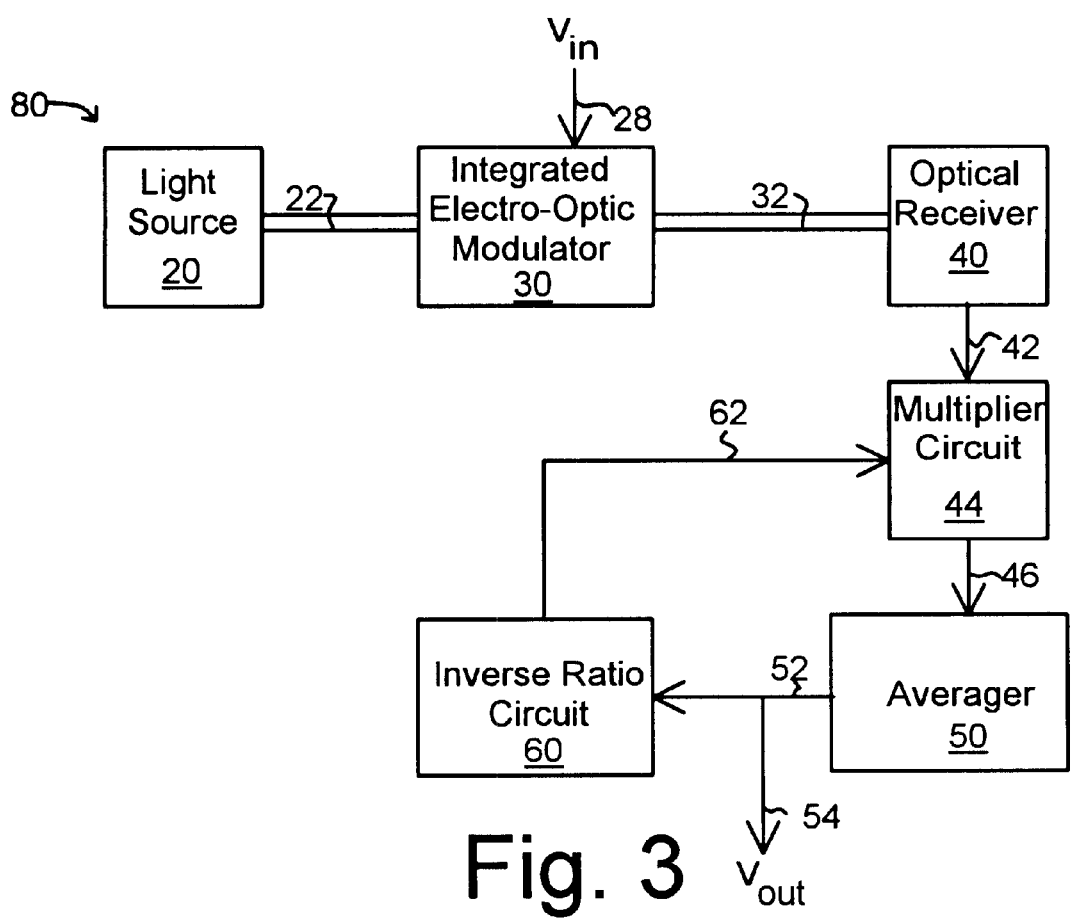
FIG. 3 is a schematic block diagram in which the voltage from the inverse ratio circuit is returned to a multiplier circuit that multiplies the voltage from the optical receiver by the voltage from the inverse ratio circuit to give an output voltage that is the rms of the input voltage.
Figure 4:
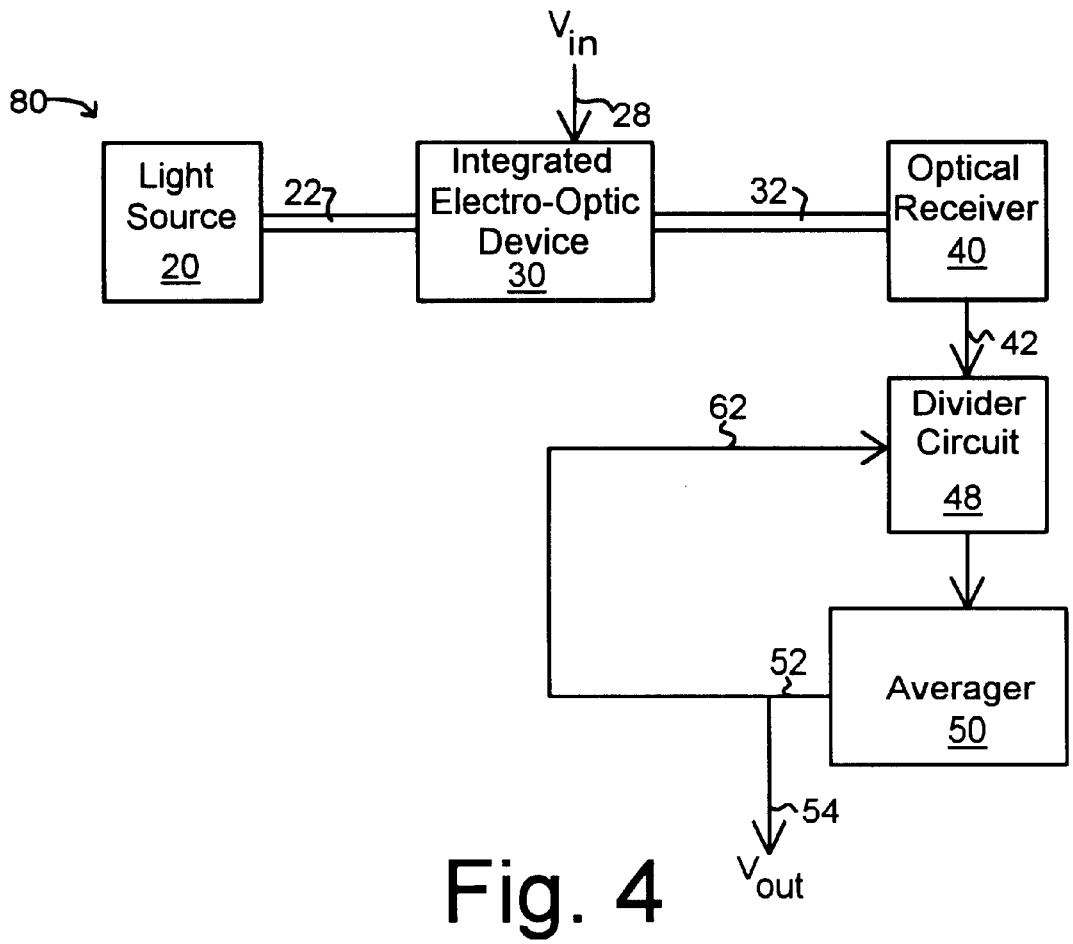
FIG. 4 is a schematic block diagram in which the voltage from the averager circuit is used as an input to a divider circuit that divides the voltage from the optical receiver by the voltage from the averager circuit to give an output voltage that is the rms of the input voltage.
Figure 5:
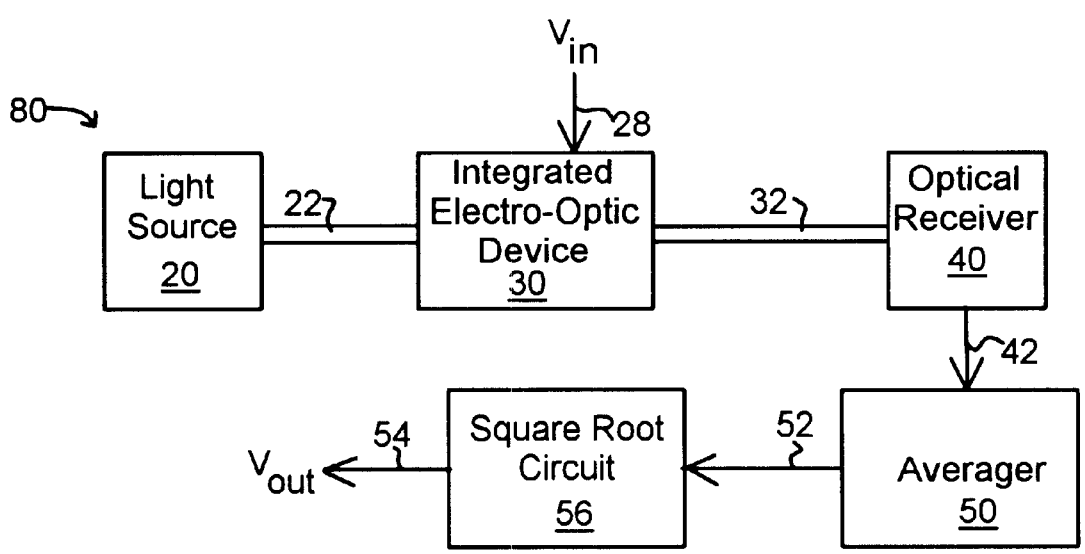
FIG. 5 is a schematic block diagram in which the squared voltage from the electro-optic device and optical receiver are processed by an averager with the output voltage sent to a square root circuit to obtain an output voltage that is the root-mean-square (rms) of the input voltage.

As will be seen with respect to a discussion of FIGS. 2–5, the inverse voltage in line 62 can be used to control a light source intensity driver 24 for light source 20 (FIG. 2) or used with the voltage in line 42 via a multiplier circuit 44 (FIG. 3) to provide a true root-mean-square (rms) voltage in line 54. Alternatively, the voltage in line 52 can be processed with the voltage in line 42 using a divider circuit to provide a true rms voltage in line 54 (FIG. 4) or the voltage in line 52 can be processed with a square root circuit to provide the rms output as shown in FIG. 5.

In addition to the basic electro-optical device 80 shown in FIG. 1 and as will be discussed later, the measurement device 10 also features: 1) a housing 150 surrounding the electro-optic material 30 for controlling the environment of device 30, 2) a switch 120 for switching between a calibration source and the unknown voltage in line 12 ($V_{in}$), 3) an input conditioning circuit 130 for determining the frequency of the unknown voltage $V_{in}$ and, if necessary, attenuating or amplifying the unknown voltage $V_{in}$, and 4) a DC null circuit 140 that provides for stable operation of the electro-optical device 30 as a square law device or squarer of the input field from line 28. The device typically operates under the control of a computer 100 which can further improve the accuracy of the rms output voltage in line 54 by applying frequency, amplitude, component, and circuit corrections from look-up tables to the rms output voltage.

Figure 2:
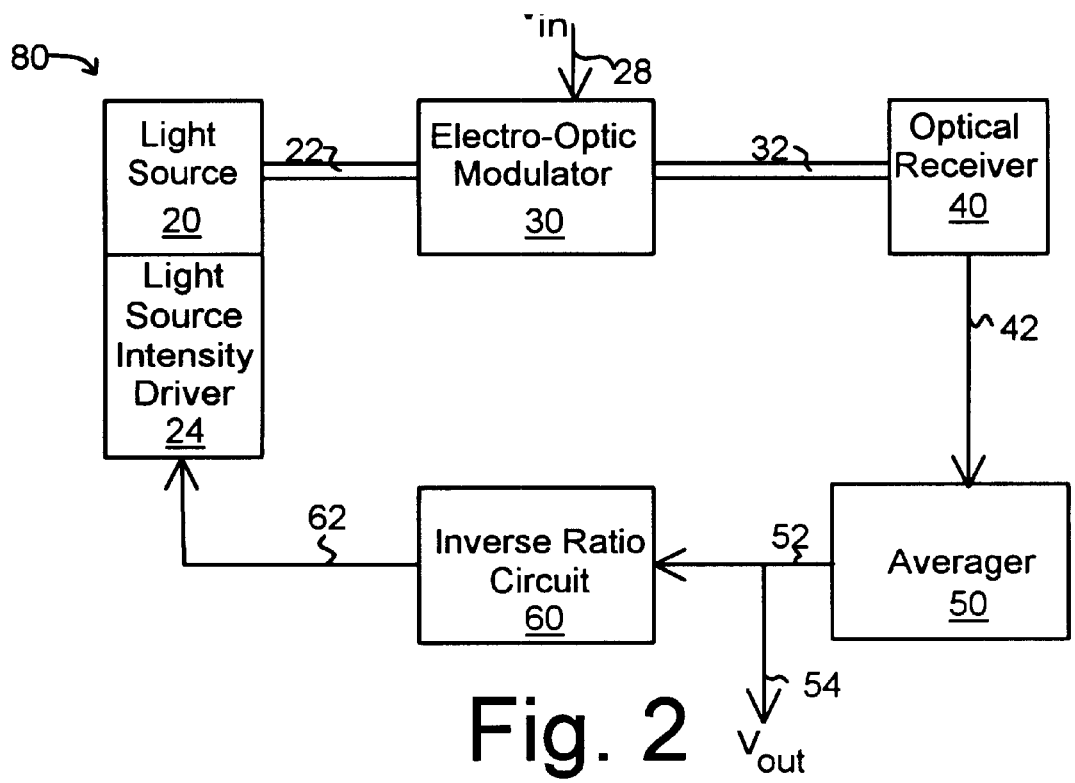
FIG. 2 is a schematic block diagram further detailing the electro-optical device of FIG. 1 in which the inverted DC voltage from the inverse ratio circuit is used to control the light source intensity driver.

Referring to FIGS. 2–5, and initially FIG. 2, the electro optic material 30 and optical receiver 40 function as a square law device to provide a voltage in line 42 that is the square of the input voltage in line 28. The voltage is passed to the averager 50 and the output is passed to an inverse ratio circuit 60 that is used to control the light source intensity driver 24. Light source intensity (power) drivers with intensity (power) control input are well known such as the Melles-Griot Model 06DLD203A available from Electro Optics of Boulder CO. Such devices have an intensity and/or power control input that can be conveniently connected to a control voltage. One of the key features in the current invention is the use of the output voltage in line 62 from the inverse ratio circuit 60 to control the intensity (power) of light source 20. As a result, the intensity of the light source 20 decreases with an increase of the input voltage in line 28. Effectively this converts the squared voltage output in line 42 (i.e., a voltage in line 42 that varies with the square of the input voltage $V_{in}$) to a linear voltage and has the advantage of increasing the dynamic input range of the device by a factor of 10 dB.

Alternatively, and as shown in FIG. 3, the inverse voltage in line 62 produced by the inverse ratio circuit 60 can be processed by a multiplier circuit 44 to provide a linear output voltage in line 46. That is, the voltage in line 42 which is a squared voltage of $V_{in}$, i.e. $V_{in}^2$ is multiplied by the inverse average voltage in line 62 ($1/V_{in}$) to give a linear voltage in line 46, i.e., ($V_{in}^2 \times 1/V_{in}$). As shown in FIG. 4, the same result can be achieved by eliminating the inverse ratio circuit 60 and returning the output voltage from the averager and using it as a divider in a divider circuit 48 that divides the squared voltage by the averaged output voltage in line 52, i.e., ($V_{in}^2/V_{in}$). In FIG. 5, the voltage in line 52 ($V^2$) is the average of the "squared" voltage in line 42 ($V^2$). This voltage ($V^2$) is processed with a square root circuit 56 to give the true rms output voltage $V_{out}$. As will be appreciated by those skilled in the art, the use of averager, divider, multiplier, and square root circuits is well known in the art as illustrated in R. B. Northrop, Introduction to Instrumentation and Measurements, CRC Press, Boca Raton, Fla., 1997) all of which is incorporated by reference as if completely written herein. FIGS. 2–4 illustrate what may be referred to as an implicit rms determination method while FIG. 5 illustrates an explicit rms determination method. Generally the use of an inverse ratio circuit as a control voltage for the light source intensity driver 24 as shown in FIG. 2 is the preferred mode of operation of the present invention as it affords a dramatic increase in the dynamic input range (10 dB) and eliminates the "squared voltage output" handling by optical receiver 40 and the subsequent circuitry. Such large voltage outputs must be handled in varying degrees by the various circuits illustrated in FIGS. 3–5.

Another key advantage of the use of the electro-optic device 30 is that it eliminates high-frequency processing in the electronics portion of the device. High frequency input and procession is found only in the electro-optic device 30. All electronics processing in the optical receiver 40 and afterwards is at dc or low frequencies. The inverse ratio light source control circuitry of FIG. 2 can be used with both bulk and integrated electro-optic devices 30 to significantly improve the dynamic range of the device. The use of an integrated electro-optic configuration 30 results in a small and very rugged device that can be used with the various electronic signal processing circuits of FIGS. 2–5. Most preferred is the use of an integrated electro-optic device 30 with an inverse ratio circuit to control the light source intensity and provide a small, rugged device with a high, dynamic input range.

Light Source Module 20

Figure 6:
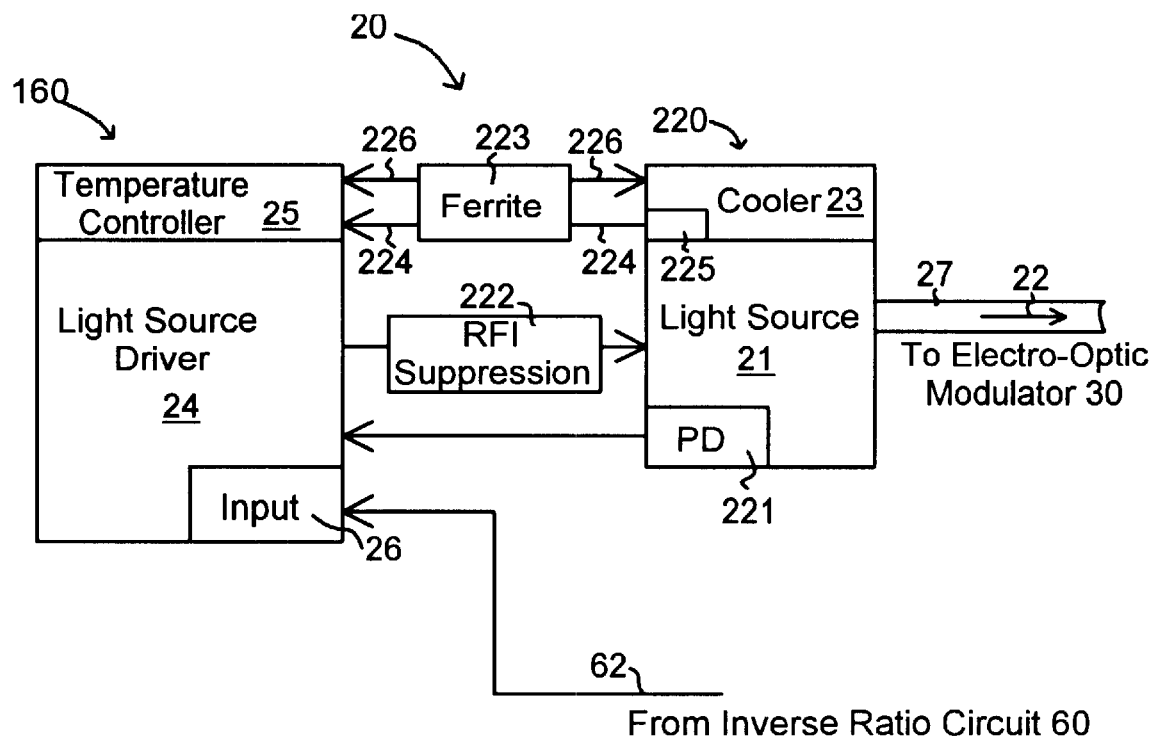
FIG. 6 is a detailed block diagram of the light source module detailing the light source, the light source driver, light source temperature controller with associated Peltier cooler, photodiode for power intensity control, an input for light intensity control using the feedback voltage from the root-mean-square output, and the use of noise control devices.

Referring to FIGS. 1–6 and especially FIGS. 2 and 6, the light source module 20 comprises a light source 21 selected to provide electromagnetic radiation 22 in the infrared to the ultraviolet region. Preferably a light source 21 such as a light-emitting diode (LED) or infrared-emitting diode (IRED) such as are commonly used in fiberoptic technology. Most preferred is a source of at least some coherent radiation such as found in lasers or laser diodes such as the Ortel 1710B DFB (distributed feedback) laser (Ortel Corporation (Alhambra, Calif., a part of Lucent Technologies' Microelectronics Group). The Ortel laser 21 operates at 1550 nm and includes an optical isolator to prevent optical feedback into the cavity causing intensity and frequency disturbances. It is connected to the electro-optic module 30 by means of a pigtail polarization maintaining (PM) fiber 27. The normal operating range of the laser is about 3 mW to 30 mW with a maximum rated power of 35 mW. The laser diode has a threshold drive current of 2.5 mA with about 220 mA required for a 30 mW output. The Ortel diode 21 was used with a Melles-Griot Power Source Package (06DLD203A; Boulder CO) 160 that consists of a light source driver 24, a light source temperature controller 25, and an input interface connection 26 for connecting the driver 24 to the input control voltage in line 62 received from the inverse ratio circuit 60.

When the inverse voltage in line 62 is connected to the light source driver input 26 and used to control the light source output power 22 over a relatively wide range, e.g., 10 dB, it is highly desirable that the drive voltage from line 62 and light source power output 22 have a linear transfer characteristic. To this end, the Melles Griot laser diode driver 24 allows for operation in either a "stabilized current mode" or a "stabilized power mode" of operation. In the stabilized current mode, the laser current is determined solely by the voltage 62 applied to the modulation input of driver 24 and At the resulting drive current. The relationship between the modulation drive voltage 62 and the laser drive current is very linear. However, the relationship between the drive current and the laser output power 22 is not as good. The latter relationship shows saturation effects at high power levels. The modulation slope sensitivity over the quasi-linear range in constant current mode is approximately 9.4 mW/V.

In the "stabilized power mode," the Melles-Griot power supply uses an internal power-monitoring photodetector 221 that is located at the rear of the laser diode package 220 to stabilize and linearize the transfer slope between the modulating input voltage in line 62 and the optical power output 22. In the "constant power mode", the modulation slope sensitivity is about 210 mW/mV. Although the stabilized power mode of operation showed a maximum linearity error of a few percent, this was significantly better than the stabilized current mode of operation. In addition and because of the much greater sensitivity found in the constant power mode of operation, the constant power mode was chosen as the operational mode for the device. The loop gain for the implicit true rms circuitry was modified accordingly by inserting a DC offset between the optical receiver 40 and the averager 50 in FIG. 1 (not shown). Alternatively a correction table can be stored in the computer 100 and the output voltage from the averager 50 (line 54) adjusted with computer software and to give an accurate output voltage $V_{out}$.

Figure 7:
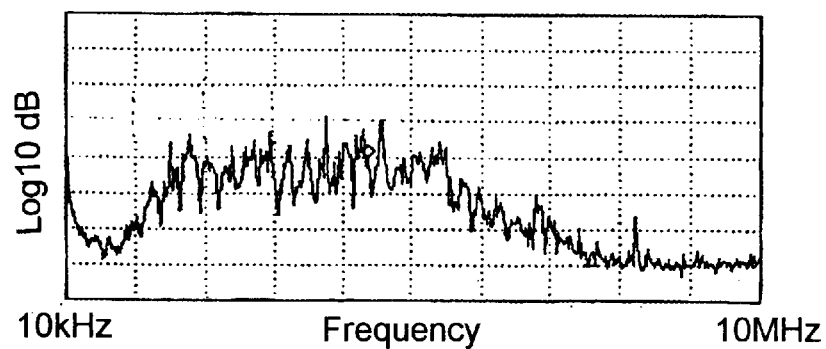
FIG. 7 is a trace illustrating the noise characteristics of the light source prior to the installation of a low pass filter.
Figure 8:
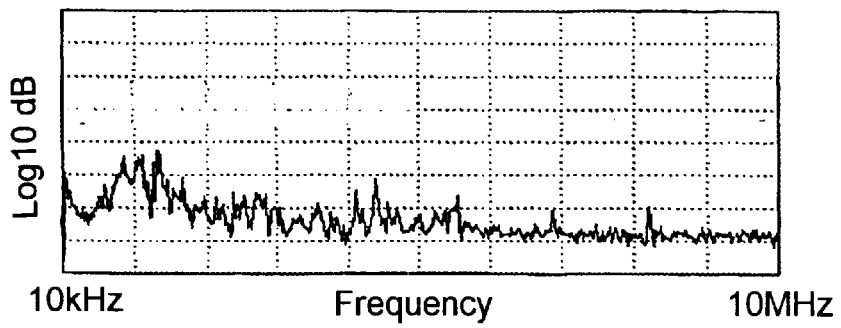
FIG. 8 is a trace illustrating the reduction in noise characteristics of the light source after installation of a low pass filter.

To reduce the noise characteristics of the light source 21, a low pass filter 222 was used in series between the light source 21 and the laser driver 24 to reduce radio frequency interference (RFI) from the driver 24. FIGS. 7 and 8 show the laser output noise level without and with the use of a low pass filter, respectively. An extraneous noise spike at 8.2 MHz was noted and removed by using a clamp-on ferrite filter 223 around the lead from the temperature sensor (thermistor) 225 at the laser 21 to the temperature controller 25 and the power lead 226 from the temperature controller 25 to the thermoelectric laser cooler 23. The use of a Peltier cooler 23 inside of the light source package 220 maintains constant laser temperature which extends the laser diode lifetime and reduces considerably changes in wavelength caused by changes in carrier density during the modulation process.

Although many of the above refinements are related to the specific light source 21 that was used and its driver 24 and temperature controller 25, those skilled in the art will recognize that a variety of components and component arrangements and modifications may be made 1) to provide a linear response between the modulating voltage input 62 and the light power output 22 and 2) to reduce as much as possible the noise in light source module 20.

THE ELECTRO-OPTIC MODULATOR

At the heart of the present invention is electric potential-light-voltage converter 70 (FIG. 1) and especially the electro-optic modulator 30 found therein. The electro-optic modulator may be of either bulk or integrated construction. In bulk construction, various components such as an electro-optic material, beam splitters, lenses, polarizers, couplers, a light source, a light receiver and other associated parts are assembled into the requisite construction as is known in the art. The only requirement of the final configuration is that it be capable of operating as a square law device. That is, the modulated output light must be a $\cos^2$ function of the input light. Because of the size, alignment and stabilization problems associated with a bulk configuration, an integrated device such as a Mach-Zehnder integrated configuration shown in FIG. 9 operating as a square-law device is preferred.

The electro-optic material used for modulator 30 includes any of the typical anisotropic material materials used in light modulation configurations including any material in which the application of an electric field causes a change in the refractive index of the material. Illustrative materials include ammonium dihydrogen phosphate (ADP), potassium dihydrogen phosphate (KDP), cuprous chloride (CuCl), cadmium telluride (CdTe), gallium arsenide (GaAs), lithium niobate ($LiNiO_3$), lithium tantalate ($LiTaO_3$), zinc selenide (ZnSe), $Bi_{12}GeO_{20}$, $Bi_{12}SiO_{20}$ and various plastics such as polyvinyldifluoride (PVDF). Lithium niobate is typically used because of its high electro optic coefficients and high optical transparency in the near infrared wavelengths. Its high Curie temperature (>1100° C.) makes it practical for fabrication of low-loss optical waveguides through metal diffusion into the substrate. Such diffusion slightly increases the refractive index of the material, thus producing an optical guiding structure. Photolithographic techniques common to the semiconductor industry are employed to delineate waveguide and electrode structures. See, for example, U.S. Pat. No. 5,267,336 all of which is incorporated by reference as if completely rewritten herein. Moreover, lithium niobate is thermally, chemically, and mechanically stable and it is compatible with conventional integrated-circuit (IC) processing technology.

Figure 9:
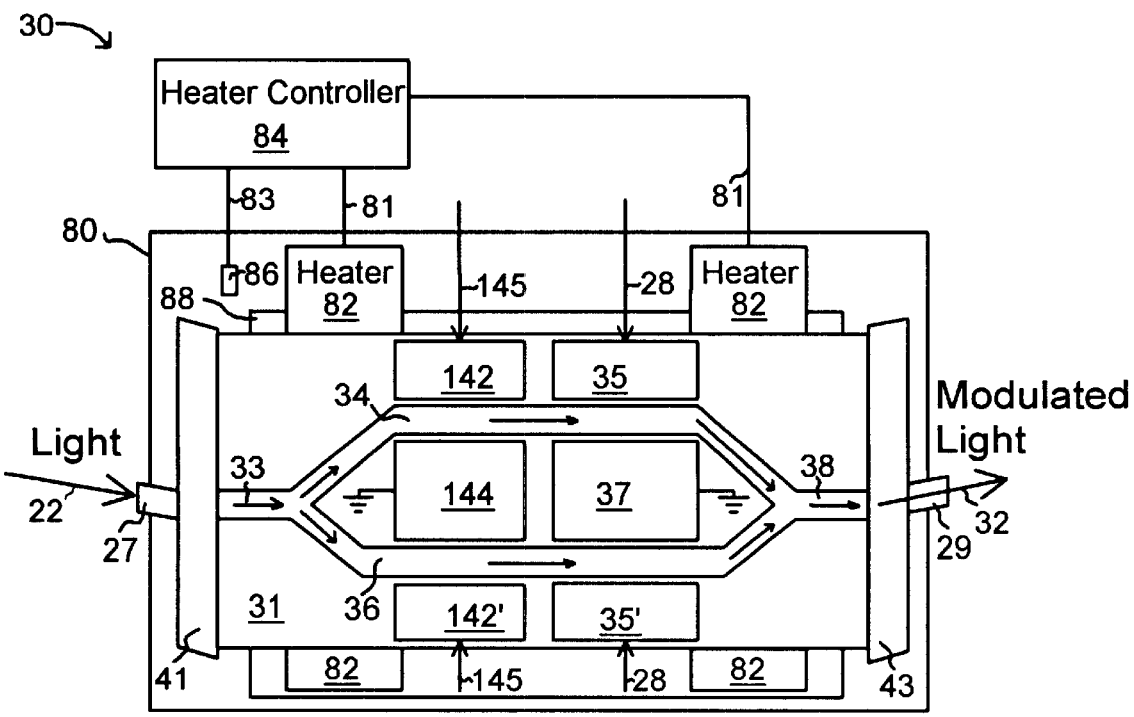
FIG. 9 is a detailed schematic drawing of an integrated electro-optical modulator illustrating the Mach-Zehnder waveguides, electrode positioning, attachment of input and output optical fibers to the Mach-Zehnder crystal substrate, heaters to control the temperature of the electro-optical device including a heater controller and thermistor, a printed circuit board to which the Mach-Zehnder crystal is attached and by which the various connections are made to the electrodes of the electro-optical device, and a housing in which the electro-optical device is enclosed.

As shown in FIG. 9, an integrated Mach-Zehnder intensity-type modulator arrangement 30 takes advantage of the interference effects of two interacting light beams. For this purpose, wave guides are formed typically by diffusing a metal such as titanium into a crystal substrate 31 such as lithium niobate in the requisite configuration. As shown, light 22 is received at waveguide 33, divided into two paths 34 and 36 and then recombined in path 38. A phase shift in the light is induced by a change in the refractive index of the crystal material in one or both of waveguide legs 34, 36 caused by applying an electric field to one or both of these waveguides 34, 36. As shown, the electric field is applied by means of electrodes applied to the substrate. As illustrated, two sets of electrodes are used. A first set of electrodes for DC bias nulling operations to maintain the device at the desired operating point and a second set for applying the radio-frequency (RF) test voltage. The nulling electrodes consist of two hot electrodes 142, 142' placed to the outside of waveguides 34 and 36 and a ground electrode 144 placed between waveguides 34 and 36. Each of the electrodes is about 9 mm long with a 10 μm gap between the ground and hot electrodes. The electrodes are typically made of gold and applied using photolithographic processing. The input electrodes are about 12 mm long, again with a 10 μm gap. Again two hot electrodes 35, 35' are placed at the outside of the waveguide pad 34, 36 while the ground electrode is placed between them. One set of electrodes can be eliminated by using a bias T arrangement in which both the dc null bias voltage and the radio-frequency input voltage use the same set of electrodes. In this situation a resistor is used in series with the dc bias input and a capacitor is used in series with the ac input.

A conventional push-pull electrode arrangement is used to apply opposite fields to each of the waveguide paths 34 and 36. This causes the refractive index in the one path to decrease (increasing the speed of light in that path) while decreasing the refractive index in the other path which decreases the speed of light. Other electrode arrangements may be used as is known by those skilled in the art and discussed in Wooten, E. L. et al, *A Review of Lithium Niobate Modulators for Fiber-Optic Communications Systems, IEEE Journal of Selected Topics in Quantum Electronics*, Vol. 6, No. 1 (January/February 2000).

Figure 10:
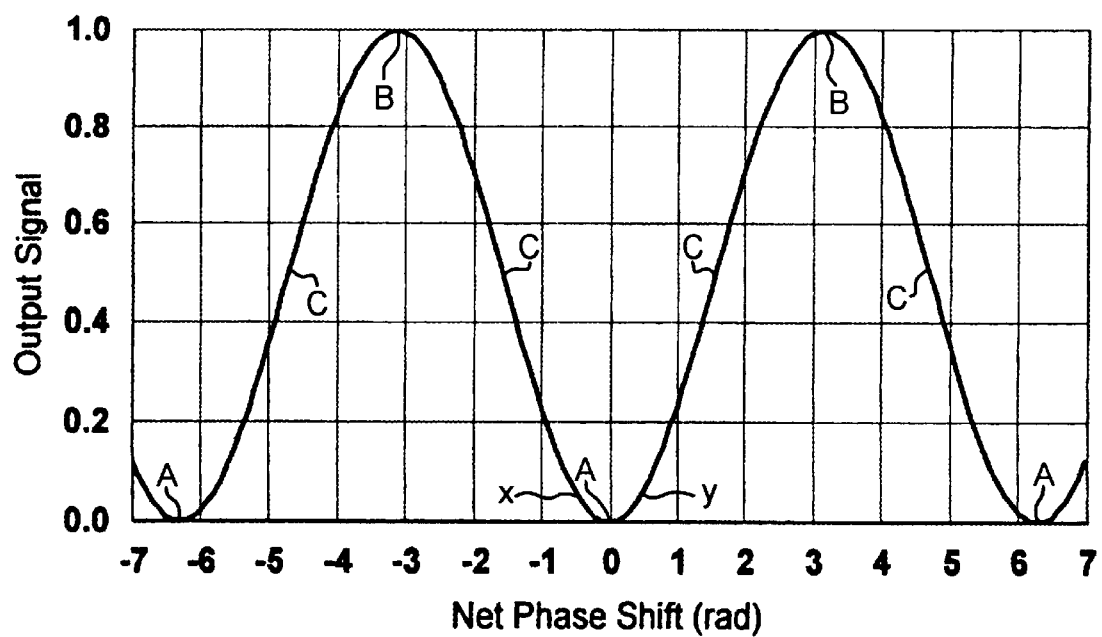
FIG. 10 is a plot of the Mach-Zehnder interferometer transmission characteristic.

As seen in FIG. 10, when an increasing electric field is applied to one or both of the legs 34, 36 of interferometer 30 (by increasing the voltage to the electrodes 35, 35'), the light in each waveguide leg 34 and 36 combines in waveguide 38 with varying amounts of destructive interference. For example, at 0 radians (point A), the light in one leg is completely out of phase with the light in the other leg so that on recombination in waveguide 38, the light in the two paths completely cancel each other and no light is emitted from waveguide 38. This is referred to as destructive interference. As the voltage increases (or decreases), a portion of the light begins to emerge from waveguide 38 and increases to a maximum B at about 3.14 radians (π radians) where the light in both waveguides 34, 36 is completely in phase and the output is said to subject to constructive interference. The voltage change to move from complete destructive interference to complete constructive interference, that is, from an intensity minimum to an intensity maximum is referred to as "$V_\pi$". At the intensity minimum A, all of the light is lost to the substrate 31 while at the maximum B, all of the light emerges through waveguide 38. Midway between the minima and maxima, is the so-called phase-quadrature point C where half of the light is lost to the substrate 31 and the other half emerges from waveguide 38. Since the curve is essentially linear at the midpoint C, i.e., the phase-quadrature point, this point is chosen as the operating point or "bias" for essentially all electro-modulators in use today.

Unlike conventional wisdom which teaches the quadrature point as the desired point of operation, the present invention features an interferometer working at the non-linear optimum or minimum points A or B with the minimum point A being the preferred point of operation. That is, the current invention operates as a "squarer" rather than the usual preferred linear mode of operation.

To this end and as shown in FIG. 9, the integrated Mach-Zehnder interferometer of the current invention was designed with a small amount of asymmetry, i.e., waveguide 34 is slightly longer than waveguide 36 to place the intrinsic or natural bias point close to the central null. That is, light passing through legs 34 and 36 of the interferometer will destructively interfere with each other so that no light emerges from waveguide 38 prior to (without)the application of a voltage to the interferometer electrodes. That is, the intrinsic or normal operating point is at point A as shown on the bias curve of FIG. 10. If the legs are constructed equal to each other, all of the light emerges as a result of constructive interference of the light in legs 34, 36. Certainly it is not necessary that the interferometer be constructed so as to operate close to or at the null point A. As is known in the art, a small biasing voltage can be applied to bring the operating point of the interferometer to the linear operating point C. So to with the current invention. A biasing voltage can be applied to electrodes 142, 142' to bring the interferometer to squarer operating point regardless of the symmetry of the interferometer legs 34, 36. The slight asymmetric construction noted above serves mainly to afford an interferometer requiring a minimum biasing voltage.

In summary and slightly more mathematical terms, the Mach-Zehnder interferometer 30 of FIG. 9 works by producing constructive and destructive interference of its light output. The electrodes 35, 35' and 37 on the surface of substrate 31 induce strong, electric fields that through the electro-optic effect, modulate the phase in each arm of the interferometer. Since the electrodes can be arranged in push-pull operation as shown, when light in one arm of the interferometer undergoes a phase advance, i.e., speeds up, Δϕ radians, light in the other arm undergoes a phase retardation of Δϕ radians. The net effect is to produce a push-pull differential phase change of 2Δϕ radians. In general, the ideal interference transmission characteristic can be represented by:

$$P_o = P_i \left[ 1 - \cos\left(\frac{\Delta\phi}{2}\right)^2 \right]$$

where $P_i$ is the optical power input to the modulator and $P_o$ is the optical power output and Δϕ is the differential phase modulation index. This characteristic is also known as the "cosine-squared curve" or "bias characteristic".

Figure 11:
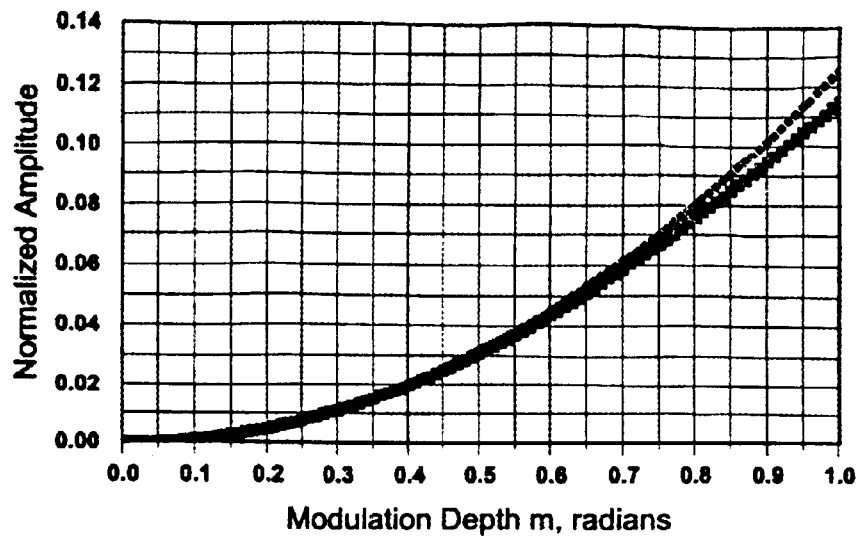
FIG. 11 is a comparison of the transfer characteristics between a perfect square response (square) and a cosine-squared response at a null (diamond).
Figure 12:
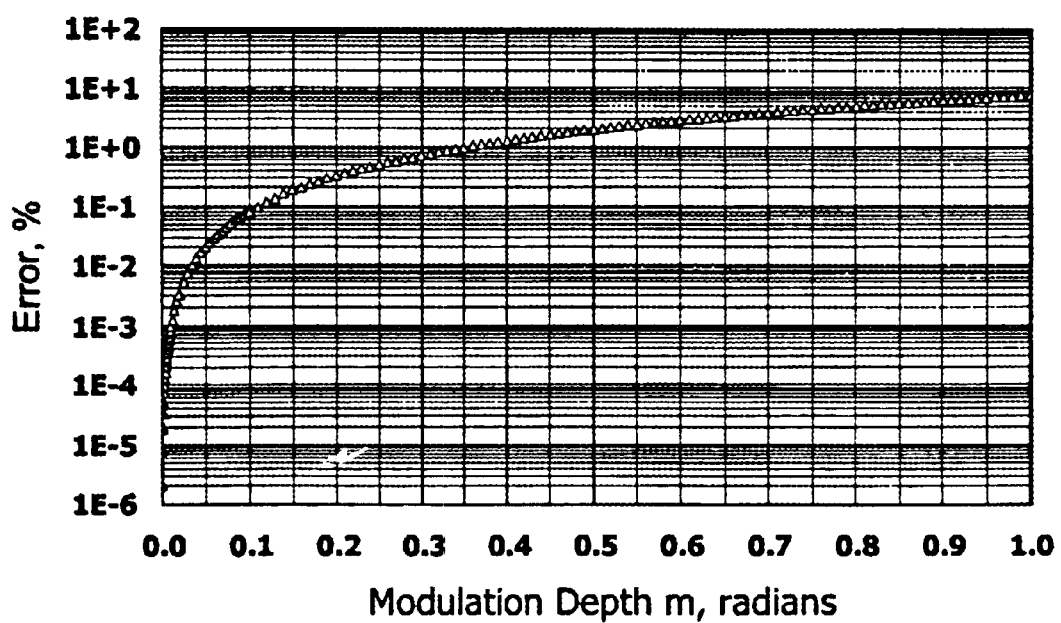
FIG. 12 is a plot illustrating the difference between a perfect squaring function and the cosine-squared response at a null.

The cosine-squared characteristics of a Mach-Zehnder interferometer "squarer" biased at null approximates to the term $\Delta\phi^2/8$, for small modulation depth m=Δϕ. The cosine squared curve can also be compared to the perfect square Bessel coefficient $[J_2(\Delta\phi)]^2$. FIGS. 11 and 12 show plots of the interferometer $\Delta\phi^2/8$ term as compared to the perfect square Bessel coefficient $[J_2(\Delta\phi)]^2$ and the error between them. In FIG. 11, the modulator square response (lower plot with diamond data points) is compared with the perfect square Bessel coefficient $[J_2(\Delta\phi)]^2$ (upper plot with square data points). In FIG. 12, the percent error is shown versus the modulation depth, that is, as the interferometer moves away from operation at the null point of total destructive interference. As is apparent, if the radio-frequency (RF) input voltage and the modulation depth Δϕ remain small, i.e., Δϕ<0.1 radians, the error in the squaring function can be maintained to less than 0.1%. Moreover this accuracy can be improved by the use of self-calibration techniques to be discussed below.

Figure 13:
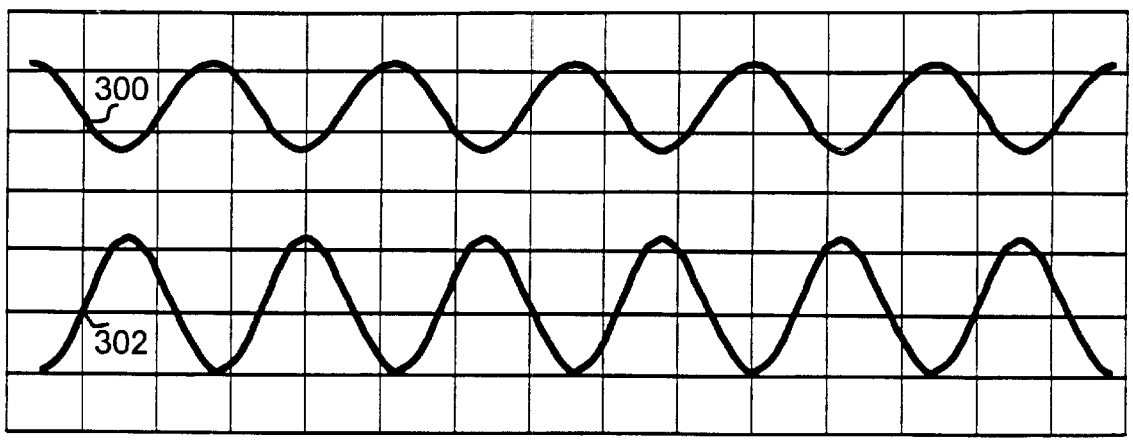
FIG. 13 gives two plots, the upper plot being a trace of a voltage input at 10 kHz to the Mach-Zehnder device while the lower trace is the output received from the optical squarer when the device is operating at quadrature.
Figure 14:
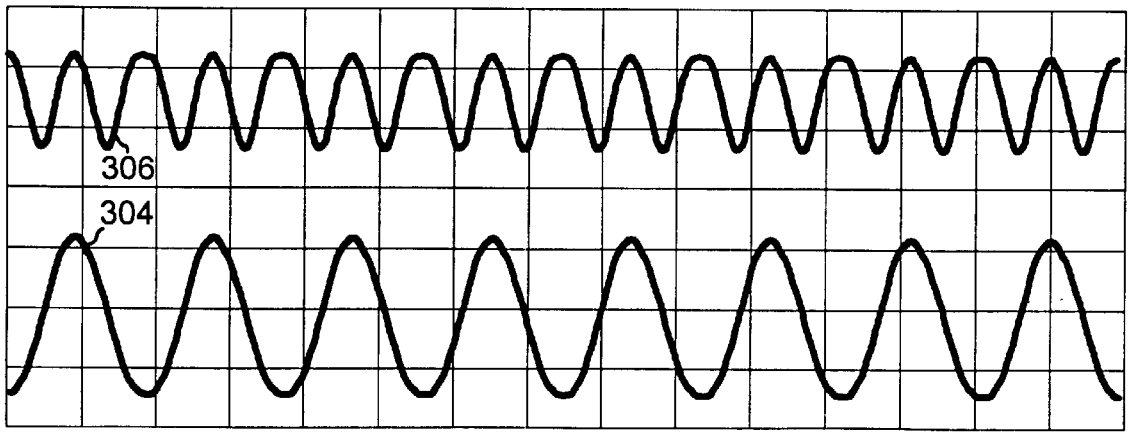
FIG. 14 again gives two plots, the lower plot being a trace of an input signal at 100 kHz and the upper plot being the output signal from the optical receiver when the Mach-Zehnder device has a bias point that is adjusted to the null. The output signal is frequency-doubled to 200 kHz as a result of the squaring action of the optical device.
Figure 15:
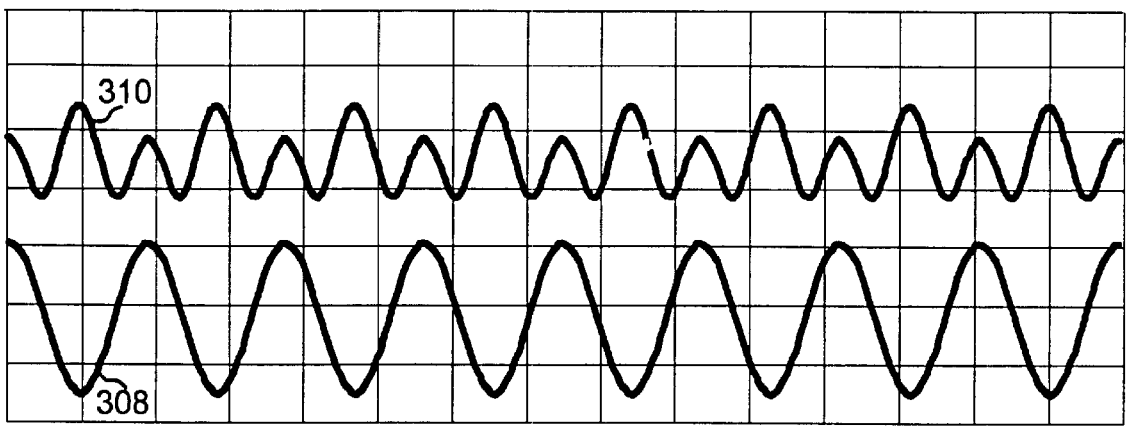
FIG. 15 again gives two plots, the lower plot being a trace of an input signal and the upper plot being a trace of the optical receiver output when the Mach-Zehnder bias point is not located exactly at the null.

FIGS. 13–15 illustrate further the operation of the electric potential-light-voltage converter 70 of FIG. 1. In FIG. 13, the upper trace 300 is formed by applying a 10 kHz voltage to the bias electrodes 142, 142' and 144. With the DC bias adjusted for linear quadrature (point C in FIG. 10), the lower trace 302 is the amplified signal obtained from the optical receiver 40. Of course, at the peak of the curve 300, the input voltage is at its greatest value causing the greatest destructive interference and the corresponding minimum trough on the lower output trace 302, i.e., the optical output is at a minimum giving rise to the lowest output voltage at the optical receiver. As evident, traces 300 and 302 vary linearly with each other. In FIG. 14, the lower trace 304 corresponds to the input 10 kHz AC voltage. In this case, however, the operating point is set to the null point (point A in FIG. 10). The output trace 306 is doubled to 200 kHz as a result of the squaring function of the electro-optical modulator 30. In looking at FIG. 10 it is seen that when operating at the quadrature point C, the output light continues to decrease as the voltage increases until the peak is reached after which the voltage decreases and the light output increases until a voltage trough is reached. That is, the voltage wave merely moves up and down the linear portion of the FIG. 10 curve when operating at the quadrature point However, when operating at null point A, the input voltage initially falls giving rise to increasing light output as constructive interference increases. However, as the input voltage turns negative, the low at the null point A is reached and the function turns upward (becoming more positive) even as the input voltage continues to become more negative. In effect, the output light increases and decreases twice (two cycles, one on each side of null point A, i.e., sides x and y) as the input voltage cycles only once. FIG. 15 illustrates the situation when the operating point is not quite at the null point. Here, as in FIG. 14, the input voltage is given on lower trace 308 and the output from the optical receiver 40 is given by the upper trace. In a simplistic view, because the operating point is no longer at null point A, one of the two cycles resides for a greater time on one side of null point A than the other. As a result, the output climbs to a higher output level on one side of null point A than the other. Actually the situation is more complex in that both fundamental and even harmonic components are produced in the optical receiver output when the operating point is not precisely located at the null. To a first approximation, the null point can be located by adjusting the bias voltage until the adjacent output peaks from a test AC signal are equal. More sophisticated methods can be used to determine and set the null point such as by taking the average value of alternate peaks and comparing the difference, applying an incremental DC bias voltage and repeating the process until the null is reached.

Referring to FIG. 9, input light 22 is directed from the light source 20 (FIG. 1) to the electro-optic modulator 30 by means of a polarizing maintaining optic input fiber 27. Optical fiber 27 is secured in a fiber carrier 41 and angle cut to minimize back-reflections from the fiber 27 to substrate 31 interface. The ends of the carrier 41 and the electro-optic modulator substrate 31, that is, the lithium niobate crystal are polished to an optical finish. The fiber carrier is then glued to the end of the substrate with a UV-curable epoxy. An optic fiber 29 is attached to the substrate by means of carrier 43 in a fashion similar to that used to attach input fiber 27. Because optical receivers are not polarization sensitive to any significant degree, the output fiber can be of the lower-cost single mode (SM) variety.

Typically the electro-optic modulator is mounted on a small printed circuit board (pcb) 88 which in turn is mounted to a closed or sealed housing 80. Because the bias required to maintain the electro-optical squarer at its optimum null bias point is a function of temperature, the squarer 30 is maintained in an oven like enclosure that is maintained at a temperature of about 38±2° C. Heaters 82 are provided within housing 80 and are used in conjunction with a thermistor 88 and a heater controller 84 to maintain the optical modulator at a constant temperature. A 50 Ω surface mount resistor is placed in parallel with the electrodes to provide the correct termination and govern the input impedance of the device and its power dissipation limitations.

Figure 16:
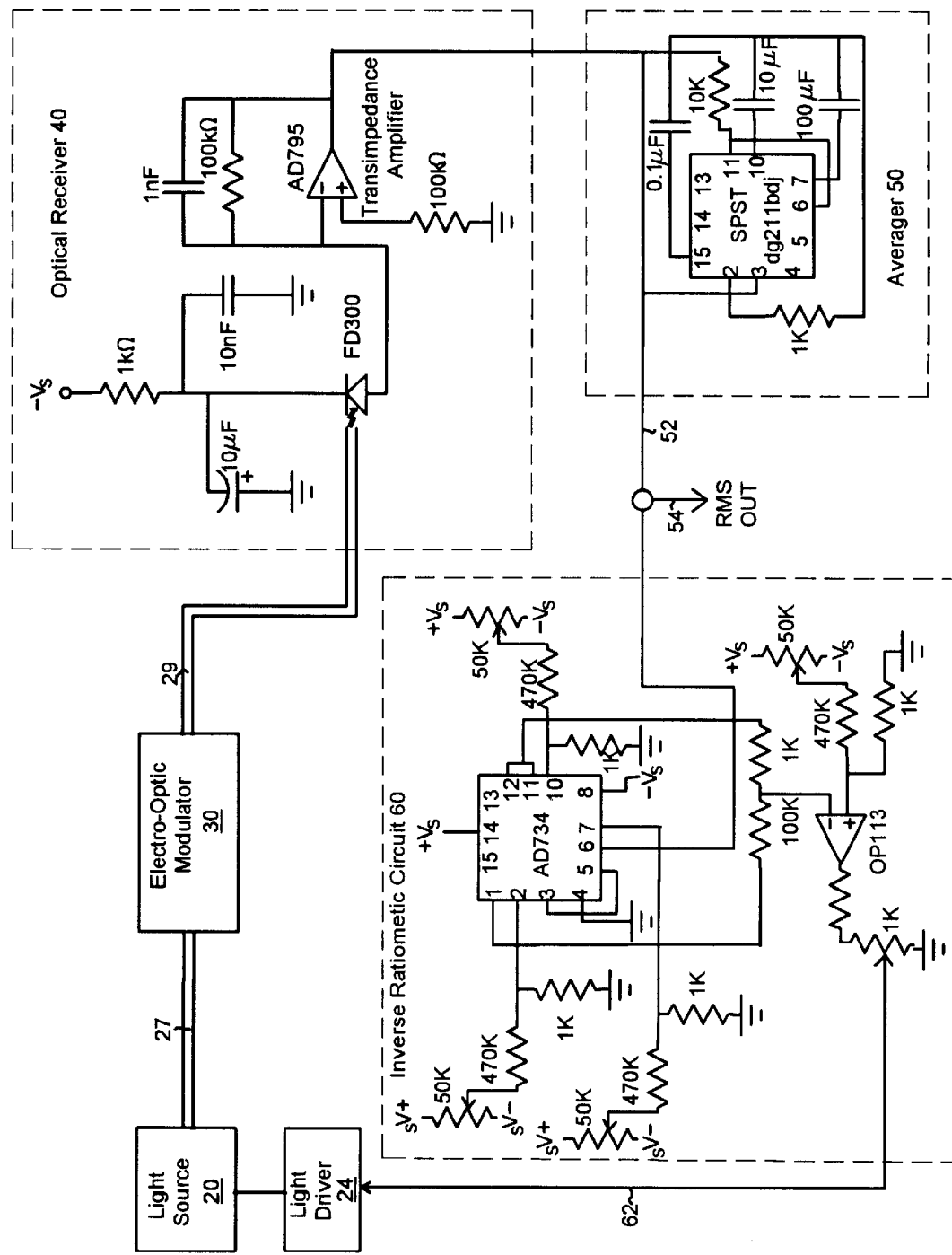
FIG. 16 is a schematic drawing illustrating the basic circuitry of the optical receiver, the averager, and the inverse ratiometric circuit used in the basic operation of the true root-mean-square voltage converter.

FIG. 16 provides further details as to the circuits for optical receiver 40, averager 50, and the inverse ratiometic circuit 60. The optical receiver uses a high speed indium gallium arsenide photodiode (FD300 from Fermionics Opto-Technology, Simi Valley, Calif.) typical of photodiodes used for high speed analog and digital communications systems. An AD795 trans-impedance amplifier is used to amplify the signal after which it is passed to the averager circuit which is based on an IC chip SPST dg211bdj connected in a typical low-pass filter arrangement. The output is passed to an inverse ratiometic circuit which utilizes an IC multiplier AD534 along with op-amp OP113 to obtain the desired output which is used to control the light driver 24 in an inverse manner, that is, as the input voltage to the electro-optic modulator increases, voltage in line 62 reduced the light intensity of the light source in proportion to the voltage applied to the electro-optic modulator 30.

The device 10 of the current invention is typically pre-calibrated at the factory using accurate voltage and frequency sources. At incremental frequencies, e.g., 100 Hz, 1 kHz, and 10 kHz, the voltage is swept over the desired range, e.g., 1 mV to 1000V, and the output value is compared with the input value and suitable corrections stored in a lookup table for use with computer 100. The values are normalized to the response at, e.g., 1 kHz. This frequency is referred to as the pivot frequency.

Figure 17:
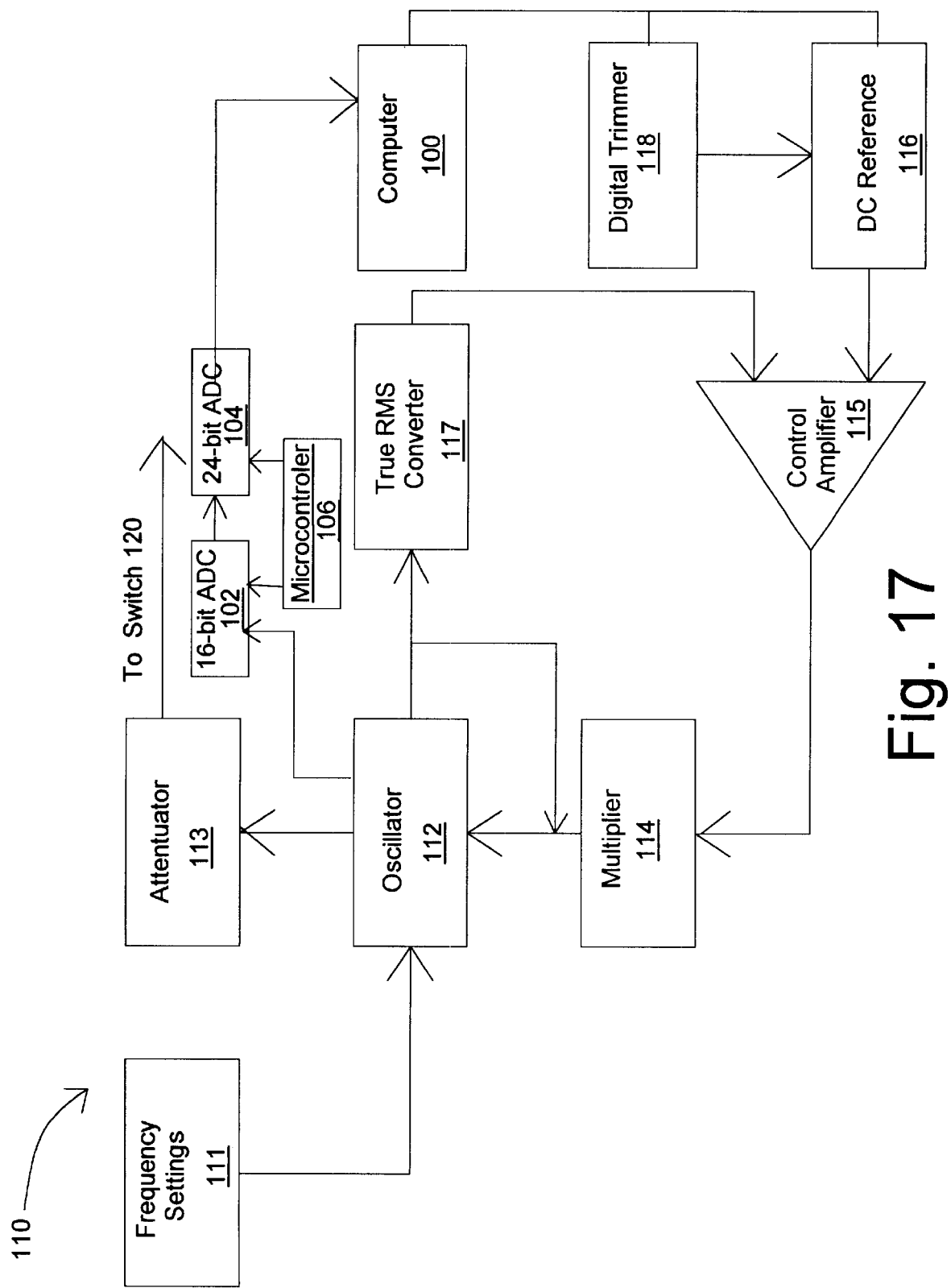
FIG. 17 is a schematic drawing illustrating in detail the workings of the AC calibration source of the current invention including an oscillator, true RMS converter, a DC reference, 16-bit and 24-bit analog to digital converters (ADCs) under the control of a micro-controller, and a digital trimmer.

As seen in FIG. 17, the heart of the AC calibration source is oscillator 112. The output is connected to a commercially available root-mean-square (RMS) converter 117. The DC output of the RMS converter is compared to a stable reference source 116 with control loop amplifier 115. The output of control amplifier 115 is connected to multiplier 114. The other input of the multiplier is connected to the output of oscillator 112. In this configuration, the multiplier is in the feedback loop of the oscillator 112 and affects the feedback resistance, thus the gain. This results in stabilizing the RMS output of the oscillator to equal the stable DC reference voltage.

In the primary mode, a fixed voltage and frequency output is provided. In the second mode, the output of the DC reference source can be adjusted by a digital trimmer 118. Control amplifier 115 automatically regulates the oscillator output to match the DC reference source voltage level. Resistor and capacitor components that make up the frequency of oscillator 112 can be modified to change the frequency from 100 Hz and 1 kHz to 10 kHz. Attenuator 113 divides the output to lower voltage levels to allow automatic generation of lookup tables for more than one range.

The high accuracy AC source 110 also functions as a multi-function AC calibrator. During the primary stable reference function, a fixed output voltage is fed to the electro-optical squarer 30. Its primary function is to provide a stable AC reference measurement interlaced with every measurement reading of the unknown input signal. A correction is then applied to an internal lookup table that characterizes the system behavior.

The AC source 110 is designed to be extremely stable over time, but is not necessarily accurate. The value of the AC source has been calculated by digitizing the output with a high speed 16-bit ADC 102 controlled by micro controller 106. A fixed amount of multiple periods are digitized for optimal accuracy. The 16-bit ADC 102 is capable of accuracy levels of 15 ppm. Calibration of ADC 102 is done with high accuracy, self-calibrating, 24-bit ADC 104 controlled by micro controller 106. Both ADCs 102,104 will measure internal DC reference sources 116. An internal digital trimmer 118 allows for a variable output of the AC source. In this mode two things occur: The exact AC RMS voltage is determined with 16 bit ADC 102. The output of the AC source is connected to the input of the Electro-Optical True RMS Converter and its DC output is measured with ADC 104. A correction factor is calculated for each AC input level and is stored in system memory 100.

The RMS value of the unknown voltage is measured by operating the instrument sequentially in three modes: (a) Null Mode, (b) Calibration Mode and (c) Measure Mode. In the null mode, a DC voltage plus a small AC signal, about 10 mV at a frequency of 1 kHz, is applied to the electrodes 142, 142' and 144 (see FIG. 9). The electrical output of the detector 40 (FIG. 1) is measured. The DC voltage level is adjusted to obtain the maximum signal output from the detector 40 at the second harmonic, 2 kHz, of the small AC input 1 kHz signal. The DC drift of the optical squarer from the null point is compensated during the Calibration and Measure modes. The optical squarer DC drift characteristics is predetermined and a time varying voltage is applied to the optical squarer to oppose the effect of the DC drift.

In the Calibration mode, an AC calibration source is applied to the Electro-Optical True RMS Converter 30. The AC calibration source operates at the pivot frequency of 1 kHz. The voltage amplitude of the AC source is varied from 10 mV to 100 mV in steps of 10 mV. The response of the instrument, $V_{out}$, is measured and stored in a lookup table. In the Measurement mode, the unknown AC voltage is connected to the optical squarer and the response of the instrument, $V_{out}$, is measured. This value is compared to the stored values in the look up table and a correction factor is applied to the measured value of the unknown voltage. This calculated value is multiplied by a second correction factor due to the frequency of the unknown voltage. The frequency of the unknown AC voltage is measured using a frequency counter. The lookup table created in the factory is looked up to find the correction factor and the true RMS value of the unknown voltage is displayed. Additional explanation of calibration techniques can be found in U.S. Pat. No. 5,440,113, U.S. Pat. No. 5,317,443, U.S. Pat. No. 5,003,624, U.S. Pat. No. 5,012,181 and U.S. Pat. No. 4,859,936 all of which are incorporated herein by reference as if completely written herein.

It is possible that changes in configurations to other than those shown could be used but that which is shown is preferred and typical. Without departing from the spirit of this invention, various equivalent alternate components may be used. It is therefore understood that although the present invention has been specifically disclosed with the preferred embodiment and examples, modifications to the design concerning components and their interconnection will be apparent to those skilled in the art and such modifications and variations are considered to be equivalent to and within the scope of the disclosed invention and the appended claims.

It is therefore understood that although the present invention has been specifically disclosed with the preferred embodiment and examples, modifications to the design concerning sizing and shape will be apparent to those skilled in the art and such modifications and variations are considered to be equivalent to and within the scope of the disclosed invention and the appended claims.

We claim:

1. An opto-electric device for measuring the root mean square value of an alternating current voltage comprising:

a) an electric field-o-light-to-voltage converter comprising:
   1) a light source;
   2) an electro-optic material:
      (a) receiving light from said light source;
      (b) modulating said light; and
      (c) providing a modulated light output;
   3) an electric field applied to said electro-optic crystal to modulate said light from said light source to produce said modulated light output;

b) an optical receiver for receiving and converting said modulated output light from said electro-optic material to a first voltage that is proportional to a square of said electric field applied to said electro-optic material;

c) anaverager circuit receiving said first voltage and providing a second voltage that is proportional to the average of said square of said electric field over a period of time; and d) an inverse ratiometric circuit receiving said second voltage from said averager circuit and returning a third voltage that is an inverse voltage of said second voltage to said electric field-to-light-to-voltage converter to produce an output voltage that is the root mean square voltage of said applied electric field.

2. The opto-electric device for measuring the root mean square value of an alternating current voltage according to claim 1 wherein said electro-optical material is used to process said light.

3. The opto-electric device for measuring the root mean square value of an alternating current voltage according to claim 2 wherein a Mach-Zehnder-type. interferometer is formed in said electro-optic material.

4. The opto-electric device for measuring the root mean square value of an alternating current voltage according to claim 1 further comprising a multiplier circuit for receiving said first voltage and said third voltage and providing said second voltage for said averager circuit.

5. The opto-electric device for measuring the root mean square value of an alternating current voltage according to claim 1 wherein said electro-optic material is an anisotropic lithium niobate crystal.

6. The opto-electric device for measuring the root mean square value of an alternating current voltage according to claim 7 wherein a Mach-Zehnder interferometer is formed in said lithium niobate crystal.

7. The opto-electric device for measuring the root mean square value of an alternating current voltage according to claim 1 further comprising an environmental container for said electro-optical material.

8. The opto-electric device for measuring the root mean square value of an alternating current voltage according to claim 1 further comprising an ac calibration circuit for applying a known ac potential at a known frequency to said electro-optic material.

9. The opto-electric device for measuring the root mean square-value of an alternating current voltage according to claim 8 further comprising an ac calibration voltage.

* * * * *

UNITED STATES PATENT AND TRADEMARK OFFICE
CERTIFICATE OF CORRECTION

PATENT NO. : 6,479,979 B1
DATED : November 12, 2002
INVENTOR(S) : Kingsley et al.

It is certified that error appears in the above-identified patent and that said Letters Patent is hereby corrected as shown below:

Title page,
Item [57], ABSTRACT,
Line 21, after the first "a" delete "Mach_Zehnder" and substitute therefor
-- Mach-Zehnder --.
Line 21, after "operating" delete the first "a" and substitute therefor -- as --.
Line 25, after "at" delete "it" and substitute therefor -- its --.

Column 1,
Line 19, after the word "the" delete "Navel" and substitute therefor -- Naval --.

Column 2,
Line 60, after "true" delete "room-mean" and substitute -- root-mean --.

Column 3,
Line 17, after the first "a" delete "Mach_Zehnder" and substitute therefor
-- Mach-Zehnder --.
Line 17, after "operating" delete the first "a" and substitute therefor -- as --.
Line 21, after "at" delete "it" and substitute therefor -- its --.

Column 5,
Line 12, after "then" delete "feed" and substitute -- fed --.

Column 6,
Line 6, after the numeral "62" delete "$(1/V_{in})$" and substitute therefor -- $(1/\overline{V}_{in})$ --.

Line 54, after "ultraviolet" delete "region. Preferably" and substitute therefor
-- region, preferably --.

Column 9,
Line 6, after "waveguide" delete "pad" and substitute therefor -- paths --.

UNITED STATES PATENT AND TRADEMARK OFFICE
CERTIFICATE OF CORRECTION

PATENT NO. : 6,479,979 B1
DATED : November 12, 2002
INVENTOR(S) : Kingsley et al.

It is certified that error appears in the above-identified patent and that said Letters Patent is hereby corrected as shown below:

<u>Column 14,</u>
Line 1, after "electric" delete "field-o-light-to-voltage" and substitute therefor
-- field-to-light-to-voltage --.
Line 47, delete "claim 7" and substitute therefor -- claim 5 --.

Signed and Sealed this

Sixteenth Day of March, 2004

JON W. DUDAS
*Acting Director of the United States Patent and Trademark Office*